United States Patent
Fillion et al.

(10) Patent No.: US 10,211,141 B1
(45) Date of Patent: Feb. 19, 2019

(54) SEMICONDUCTOR LOGIC DEVICE AND SYSTEM AND METHOD OF EMBEDDED PACKAGING OF SAME

(71) Applicant: General Electric Company, Schenectady, NY (US)

(72) Inventors: Raymond Albert Fillion, Niskayuna, NY (US); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/816,254

(22) Filed: Nov. 17, 2017

(51) Int. Cl.
  *H01L 23/49* (2006.01)
  *H01L 23/498* (2006.01)
  *H01L 27/118* (2006.01)
  *H01L 23/00* (2006.01)
  *H01L 21/768* (2006.01)

(52) U.S. Cl.
  CPC .. *H01L 23/49838* (2013.01); *H01L 21/76877* (2013.01); *H01L 23/49816* (2013.01); *H01L 23/49827* (2013.01); *H01L 24/09* (2013.01); *H01L 24/17* (2013.01); *H01L 27/118* (2013.01); *H01L 23/49* (2013.01)

(58) Field of Classification Search
  None
  See application file for complete search history.

(56) References Cited

U.S. PATENT DOCUMENTS

| | | | | |
|---|---|---|---|---|
| 5,341,564 A | * | 8/1994 | Akhavain | H01L 23/13 174/557 |
| 5,353,498 A | | 10/1994 | Fillion et al. | |
| 5,774,340 A | * | 6/1998 | Chang | H01L 23/50 174/255 |
| 5,841,193 A | | 11/1998 | Eichelberger | |
| 5,888,837 A | * | 3/1999 | Fillion | G01R 1/04 438/15 |
| 5,946,546 A | | 8/1999 | Fillion et al. | |
| 6,008,534 A | * | 12/1999 | Fulcher | H01L 23/49822 257/690 |

(Continued)

OTHER PUBLICATIONS

Tanaka et al., "Thinner and Miniature Embedded Device Package, MCeP, for PoP and Module Application", Shinko Electric Industries Co., Ltd., 45th International Symposium on Microelectronics, Sep. 9-13, 2012, San Diego, CA pp. 001010-001017.

(Continued)

*Primary Examiner* — Michael Lebentritt
(74) *Attorney, Agent, or Firm* — Ziolkowski Patent Solutions Group, SC

(57) ABSTRACT

An embedded semiconductor package includes a semiconductor logic device comprising a plurality of signal input/output (I/O) pads spaced at a first pitch on an active surface thereof and a plurality of power I/O pads and ground I/O pads spaced on the active surface at a second pitch larger than the first pitch. At least one interconnect layer overlies the semiconductor logic device. Each of the at least one interconnect layers includes an insulating layer and a conductive layer formed on the insulating layer and extending into a plurality of vias formed therethrough. The conductive layer is electrically coupled to the plurality of signal I/O pads and the plurality of power I/O pads and ground I/O pads.

27 Claims, 9 Drawing Sheets

(56) References Cited

U.S. PATENT DOCUMENTS

| | | | |
|---|---|---|---|
| 6,172,526 B1* | 1/2001 | Iwasaki | H03K 19/00315 |
| | | | 326/101 |
| 6,242,282 B1 | 6/2001 | Fillion et al. | |
| 7,514,767 B2 | 4/2009 | Yang | |
| 7,662,667 B2 | 2/2010 | Shen | |
| 7,674,655 B2 | 3/2010 | Chua et al. | |
| 7,847,404 B1* | 12/2010 | Schwegler | H01L 23/49827 |
| | | | 257/532 |
| 7,932,744 B1* | 4/2011 | Greene | H03K 19/17744 |
| | | | 326/101 |
| 8,008,125 B2 | 8/2011 | McConnelee et al. | |
| 8,093,722 B2 | 1/2012 | Chen et al. | |
| 8,114,708 B2 | 2/2012 | McConnelee et al. | |
| 8,163,596 B2 | 4/2012 | Kapusta et al. | |
| 8,664,044 B2 | 3/2014 | Jin et al. | |
| 8,754,514 B2 | 6/2014 | Yu et al. | |
| 8,759,964 B2 | 6/2014 | Pu et al. | |
| 8,779,601 B2 | 7/2014 | Gan et al. | |
| 8,916,481 B2 | 12/2014 | Gan et al. | |
| 8,927,412 B1* | 1/2015 | Lin | H01L 23/49811 |
| | | | 438/613 |
| 9,018,969 B2* | 4/2015 | Ishikawa | G11C 29/025 |
| | | | 257/774 |
| 9,129,981 B2 | 8/2015 | Yap et al. | |
| 9,281,286 B1 | 3/2016 | Yap et al. | |
| 9,318,429 B2* | 4/2016 | Hu | H01L 23/49861 |
| 9,432,298 B1* | 8/2016 | Smith | H04L 49/9057 |
| 9,520,372 B1 | 12/2016 | Jeng et al. | |
| 9,548,240 B2 | 1/2017 | Lin et al. | |
| 9,761,565 B2 | 9/2017 | Vincent et al. | |
| 9,793,230 B1* | 10/2017 | Yu | H05K 999/99 |
| 9,837,359 B1* | 12/2017 | Chiu | H01L 23/5389 |
| 2003/0049886 A1 | 3/2003 | Salmon | |
| 2003/0209731 A1* | 11/2003 | Ali | H01L 23/50 |
| | | | 257/203 |
| 2004/0092141 A1 | 5/2004 | Salmon | |
| 2005/0156616 A1* | 7/2005 | Morishita | G01R 31/31701 |
| | | | 324/754.03 |
| 2006/0022353 A1* | 2/2006 | Ajuria | H01L 22/32 |
| | | | 257/786 |
| 2006/0185895 A1* | 8/2006 | Kalidas | H01L 23/49838 |
| | | | 174/261 |
| 2008/0104554 A1* | 5/2008 | Kobayashi | G06F 17/5036 |
| | | | 716/112 |
| 2008/0237828 A1 | 10/2008 | Yang | |
| 2009/0294938 A1 | 12/2009 | Chen | |
| 2010/0127406 A1* | 5/2010 | Higuchi | H01L 23/522 |
| | | | 257/776 |
| 2012/0032314 A1 | 2/2012 | Chen et al. | |
| 2012/0328235 A1* | 12/2012 | Christensen | H01S 5/02276 |
| | | | 385/14 |
| 2013/0040423 A1 | 2/2013 | Tung et al. | |
| 2013/0127069 A1* | 5/2013 | Boday | H01L 23/373 |
| | | | 257/777 |
| 2013/0161833 A1 | 6/2013 | Pendse | |
| 2014/0110856 A1* | 4/2014 | Lin | H01L 24/19 |
| | | | 257/774 |
| 2014/0210068 A1* | 7/2014 | Bartley | H01L 23/373 |
| | | | 257/712 |
| 2016/0307872 A1* | 10/2016 | Chen | H01L 21/486 |
| 2017/0084596 A1* | 3/2017 | Scanlan | H01L 25/50 |
| 2018/0130732 A1 | 5/2018 | Tuominen et al. | |
| 2018/0130747 A1 | 5/2018 | Tuominen et al. | |

OTHER PUBLICATIONS

Shen et al., "Design of On-Chip Microwave Filters in Integrated Fan-Out Wafer Level Packaging (InFO-WLP Technology", National Taiwan University, Tiawan, APEMC Conference 2015 IEEE, pp. 1-3.

* cited by examiner

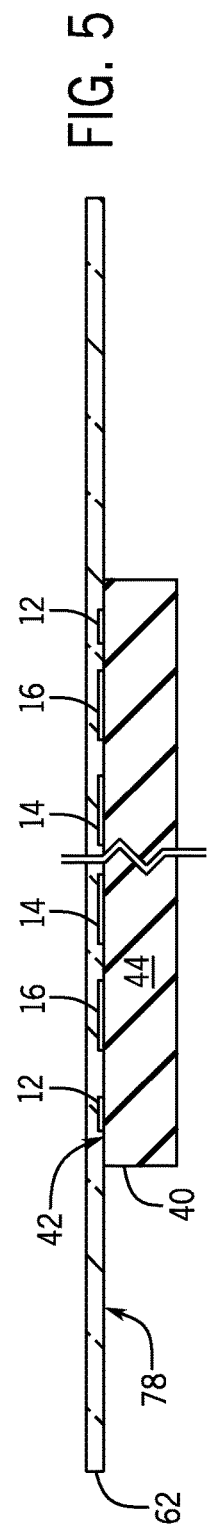

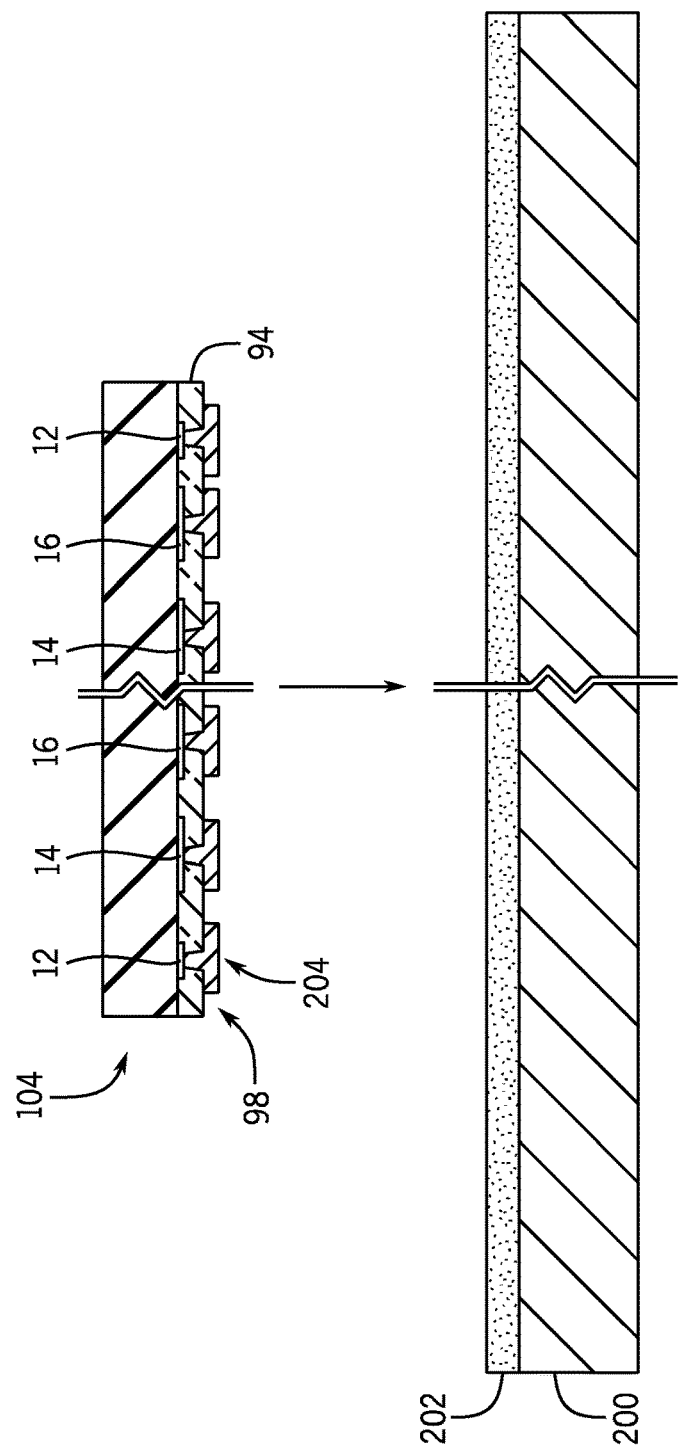

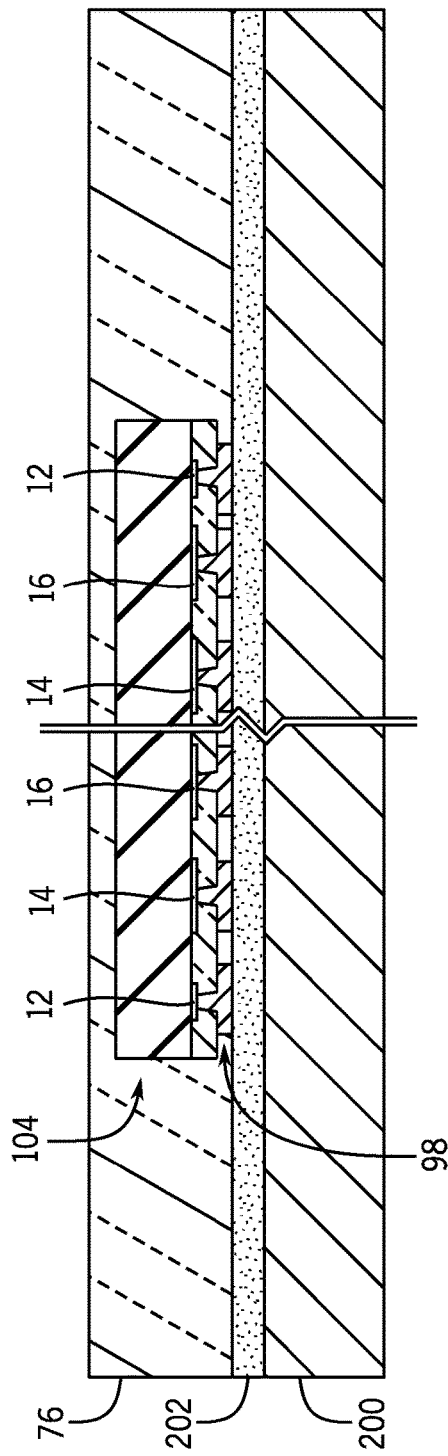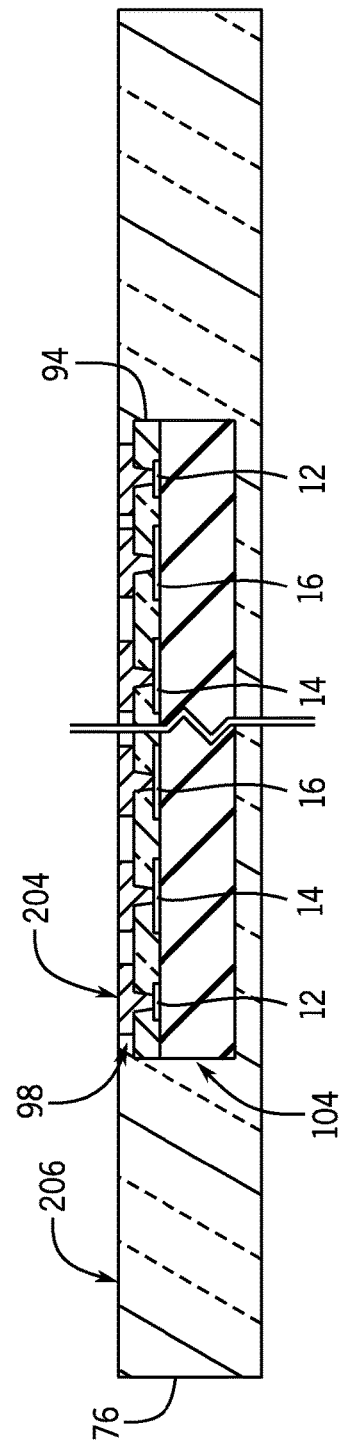

SEMICONDUCTOR LOGIC DEVICE AND SYSTEM AND METHOD OF EMBEDDED PACKAGING OF SAME

BACKGROUND OF THE INVENTION

Embodiments of the invention relate generally to semiconductor logic devices and structures and methods for packaging semiconductor logic devices within embedded chip packages.

High performance, high pin count semiconductor logic devices or chips have hundreds or thousands of input/output ("I/O") pads for signals, power, and ground. FIG. 1 depicts an exemplary prior art semiconductor logic device 10 with signal I/O pads 12, power I/O pads 14, and ground I/O pads 16 arranged for flip chip solder bump attach. As shown, I/O pads 12, 14, 16 have the same pad size or diameter and are arranged in a uniform array on a grid of uniform x-axis pitch and y-axis pitch distributed over the whole surface of the device 10. A skilled artisan will recognize that a typical complex semiconductor logic device such as a microprocessor, applications processor, or graphics processor would have many more I/O pads than illustrated in FIG. 1. As such, semiconductor logic device 10 is depicted with break lines to represent portions of the semiconductor logic device 10 that have been omitted for clarity purposes.

Semiconductor logic devices such as device 10 are generally mounted to a board, substrate, or interconnect structure 18 by flip chip attach to form a flip chip package 20 as shown in FIG. 2. Solder bumps 22 are attached to each I/O pad 12, 14, 16 and reflowed to attach the device 10 to the upper pads 24 of the multi-layer interconnect structure 18. Interconnect structure 18 has multiple interconnect layers 26, each comprising an insulating layer 28, a wiring layer 30, and metallized vias 32 formed through the insulating layer 28. An underfill resin 34 lies between semiconductor logic device 10 and interconnect structure 18 and encapsulates the solder bumps 22 to control coefficient of thermal expansion (CTE) induced solder fatigue. The interconnect layers 26 electrically couple I/O pads 12, 14, 16 to the lower I/O terminals 36 of the multi-layer interconnect structure 18. Solder balls 38 are attached to the lower I/O terminals 36 and are used to interconnect the interconnect structure 18 to an external structure (not shown) such as a mother board.

Typically, high-end semiconductor logic chips have 70 to 85 percent of all I/O pads dedicated to power and ground due to high power/ground current levels in these devices and performance limitations of the solder bumps. Solder bumps have high resistance losses due to their low electrically conductivity and current limitations due to electro-migration susceptibility. This need for high numbers of power and ground I/O pads can force chip designers to increase the size of a high-end chip to a size larger than the design's gate count requires. Larger chips result in fewer chips per wafer and lower wafer level chip yields, which increases the cost of the chip.

For the past five decades, semiconductor processing has evolved to ever smaller minimum feature sizes—from tens of microns fifty years ago to ten to fifteen nanometers today. Smaller feature sizes allow semiconductor designers to design chips with small elements and permit more semiconductor elements, transistors, or gates per unit area, therefore providing more functionally per chip. This semiconductor evolution trend has generally been done in discrete steps defined by the minimum allowable feature size and are called semiconductor wafer fab nodes or semiconductor technology nodes. The 14-nanometer node is now in wide spread production with some high-end devices moving into the 10-nanometer node. These node shrinks are driven by the desire to add more gates or functionality per chip without increasing the physical size of the chip. Moving semiconductor logic device 10 from one semiconductor technology node onto another node with smaller minimum features allows the device to be shrunk to a smaller size, resulting in more devices per wafer and lower device fabrication costs. Redesigning a complex semiconductor logic device designed for fabrication on a 14-nanometer node line for fabrication on a 10-nanometer node line, for example, potentially provides a nearly 50% die size shrink. A move to an even smaller feature size semiconductor node could shrink the device even further.

Despite the ever-evolving push for device miniaturization, many flip chip devices with high I/O pad counts cannot reduce the die size when moving to a smaller feature node because of the minimum pitch allowable on solder bumped flip chip devices. The minimum pad pitch that can be flip chip solder bump attached with a sufficiently high assemble yield is referred to hereafter as the "minimum solderable pitch" and ranges from about 120 microns to about 160 microns depending on a particular assembly houses' individual assembly processes, materials, and capabilities. Flip chip devices with a full array of I/O pads on the minimum solderable pitch have a size that is pad count limited. Thus, reducing the size of semiconductor logic device 10 would require either reduction in the number of power and ground I/O pads, which would lower power and ground conductivity and device performance, or a reduction in the array grid pitch.

Reducing the array grid pitch is particularly problematic in flip chip solder ball attach. In the simplified pad configuration depicted in FIG. 1 for example, the I/O pads 12, 14, 16 are on the minimum solderable pitch. The problems found with a die shrink of a complex logic semiconductor device is best understood by looking at a specific example of device 10. Example A of device 10 is a 900 I/O pad device with a full 30 by 30 array of I/O pads on a 150 micron pitch grid, with a die size of 4.5 mm×4.5 mm. In this example, there are 116 perimeter I/O signal pads all located on the outer row of the 30 by 30 array of pads. Device 10 also has 392 I/O power pads and 392 I/O ground pads all located in the inner rows of the array. A die shrink may also be carried out on a semiconductor device having a lower I/O count. For example, Example B of device 10 is a 64 I/O pad device with a full 8 by 8 array of I/O pads with the same pad pitch as Example A, 150 microns. It has a die size of 1.2 mm×1.2 mm. It has 28 signal I/O pads on the outer rows of the array. It has 18 I/O power pads and 18 I/O ground pads. A device with an array grid pitch of 150 microns would typically have 60-70 micron diameter I/O pads and an 80-90 micron solder bump diameter. A tighter grid pitch would require smaller I/O pads, smaller solder bumps, and would have lower bump conductivity, higher assembly costs, higher risk of bump-to-bump shorting, and lower solder fatigue compliance. As a result, designers may move a flip chip device that is pad count limited to a smaller semiconductor node to get improved device performance but the die size could not be shrunk without lower assembly yield, lower device reliability and increased costs.

One known technique for reducing pitch below the minimum solderable pitch is to replace the flip chip solder bumps 22 (FIG. 2) with copper pillars formed on the I/O pads 12, 14, 16 of semiconductor logic device 10. A thin layer of solder layer would be applied at the end of the copper pillars, often as a paste, and reflowed to couple the semiconductor logic device 10 to the interconnect structure 18. While copper pillars can be used on a tighter pitch than the minimum solderable pitch without causing a pad-to-pad short, shrinking the pitch of a copper pillar/solder layer flip chip attach structure increases the risk of electro-migration failures.

Another approach to addressing the performance limitations of flip chip and copper pillar interconnections is to embed logic devices into an organic substrate and form a build-up structure over the chip. U.S. Pat. No. 8,163,596 discloses an embedded chip module that bonds a semiconductor chip under an organic interconnect structure and encapsulates the chip in an organic molding material. The interconnect structure fans out the I/O pads of the chip to the perimeter region outside of the chip forming a fan-out wafer level device. U.S. Pat. No. 5,946,546 applies an organic interconnect structure of the surface of a semiconductor chip and fans in the chip I/O pads from the perimeter of the chip to an array of pads above the surface of the chip in order to convert a chip designed for wire bond assembly into a device with an area array of I/O terminals configured for flip chip solder bump assembly. The resulting reconfigured device could be flip chip attached onto a board, substrate or package, eliminating wire bonds.

One key problem with utilizing embedded chip packaging is that the interconnect structure built over the chip has a yield loss due to interconnect fabrication defects such as shorts and opens. A defect in the interconnect structure that is formed after a chip is embedded in the structure would cause the chip to be scrapped along with the defective interconnect structure. Yield losses are low (1-2%) in embedded chip packages that incorporate non-complex, low I/O count chips. Complex semiconductor logic devices with high numbers of I/O pads, on the other hand, require complex interconnect structures with unacceptable yield losses of 20% or higher. A 20% embedded chip yield loss would cause 20% of the complex chips to be scrapped with the defective interconnect structures in which they are embedded. For these reasons, the implementation of embedded chip technologies to complex semiconductor logic devices has been restricted and has not been done in high volume manufacturing.

Accordingly, there is a need for a miniaturized semiconductor logic device that addresses the above limitations and can be packaged using embedded chip technologies with low interconnect yields.

BRIEF DESCRIPTION OF THE INVENTION

In accordance with one aspect of the invention, an embedded semiconductor package includes a semiconductor logic device comprising a plurality of signal input/output (I/O) pads spaced at a first pitch on an active surface thereof and a plurality of power I/O pads and a plurality of ground I/O pads spaced on the active surface at a second pitch larger than the first pitch. At least one interconnect layer overlies the semiconductor logic device. Each of the at least one interconnect layers includes an insulating layer and a conductive layer formed on the insulating layer and extending into a plurality of vias formed therethrough. The conductive layer is electrically coupled to the plurality of signal I/O pads, the plurality of power I/O pads, and the plurality of ground I/O pads.

In accordance with another aspect of the invention, a semiconductor logic device includes a semiconductor base substrate, a plurality of signal input/output (I/O) pads arranged on a first surface of the semiconductor base substrate at a first pitch, and a plurality of power I/O pads and a plurality of ground I/O pads arranged on the first surface of the semiconductor base substrate at a second pitch that is greater than the first pitch. The plurality of signal I/O pads, the plurality of power I/O pads, and the plurality of ground I/O pads provide conductive routes to internal contacts within the semiconductor base substrate.

In accordance with another aspect of the invention, a method of manufacturing a semiconductor package includes coupling an active surface of a semiconductor logic device to an insulating layer, the active surface comprising a plurality of signal input/output (I/O) pads arranged at a first pitch and a plurality of power I/O pads and ground I/O pads arranged at a second pitch greater than the first pitch. The method also includes forming a plurality of vias through the insulating layer to the plurality of signal I/O pads, power I/O pads, and ground I/O pads, forming a conductive wiring layer on the insulating layer and extending into the plurality of vias, and disposing an insulating material around at least a portion of the semiconductor logic device and an exposed first surface of the insulating layer.

In accordance with yet another aspect of the invention, an embedded semiconductor package includes a semiconductor logic device comprising a plurality of input/output (I/O) pads formed on an active surface thereof and a reconfiguration layer formed over the active surface of the semiconductor logic device. The reconfiguration layer includes an insulating layer disposed on the active surface of the semiconductor logic device and a conductive layer comprising discrete terminal pads formed atop the insulating layer and extending through vias therein to electrically couple with respective I/O pads of the plurality of I/O pads. The discrete terminal pads include a first plurality of discrete terminal pads of a first size and a second plurality of discrete terminal pads of a second size larger than the first size. The embedded semiconductor package also includes at least one rerouting interconnect layer comprising an insulator formed atop the reconfiguration layer and conductive connections that extend through the insulator and that are electrically coupled to the plurality of I/O pads by way of the plurality of discrete terminal pads. An insulating material surrounds side surfaces of the semiconductor logic device and side surfaces of the insulating layer of the reconfiguration layer.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 5-7 are schematic cross-sectional views of an electronics package during various stages of a manufacturing/build-up process, according to an embodiment of the invention.

FIGS. 12-14 are schematic cross-sectional side views illustrating various stages of a process for embedding a reconfigured semiconductor logic device, according to an embodiment of the invention.

DETAILED DESCRIPTION

Figure 3:
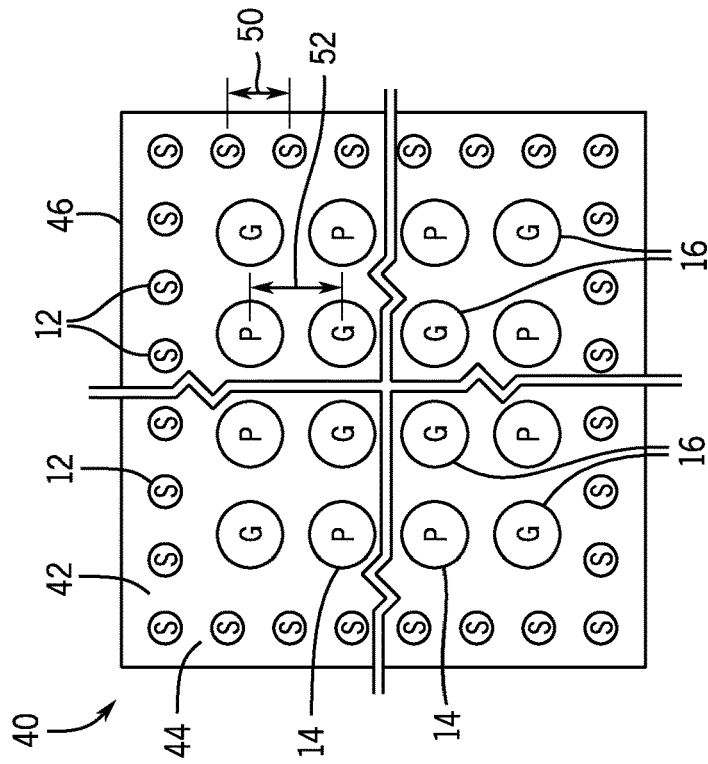
FIG. 3 is a schematic top view of a semiconductor logic device, according to an embodiment of the invention.

Embodiments of the present invention provide for semiconductor logic devices with an input/output (I/O) pad configuration that enables improved electrical performance, improved packaging yields, and reduced chip costs. Embodiments of the semiconductor logic devices disclosed herein have enlarged high current power and ground I/O pads while providing smaller, high density pads for signal I/Os. The I/O pad configuration provides the capability to shrink the overall size of the semiconductor logic device while maintaining or improving power and ground signal delivery. In some embodiments, an I/O reconfiguration structure with terminal pads is formed on the active surface of the semiconductor logic device to further improve electrical performance and reliability. Interconnect packaging structures are also disclosed herein that provide for an embedded chip module that incorporates these improved semiconductor logic devices with acceptable yield losses.

As used herein, the term "semiconductor logic device" refers to a semiconductor component, integrated circuit, device, die or chip that processes digital data in order to control the operation of electronic systems. Semiconductor logic devices are constructed from small electronic circuits called logic gates that can be used to create combinational logic. Semiconductor logic devices are formed using semiconductor elements and perform specific functions such as a microprocessor, memory device, imaging or video processing circuit, controller, digital signal processor (DSP), Application Specific Integrated Circuit (ASIC), or microcontroller, as non-limiting examples. High performance semiconductor logic devices are high pin count devices, meaning that they have hundreds or thousands of input/output (I/O) interconnection terminals for signals, power, and ground. These I/O interconnections are referred to herein as I/O pads, are used to connect the semiconductor logic device to external circuitry, and are electrically coupled to internal elements within the semiconductor logic device.

While the various embodiments of electronics packages referenced below are shown and described as including a particular arrangement of a semiconductor logic device, interconnection wiring, and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor logic devices than those listed above. The electronics packages described herein may also include one or more resistors, capacitors, inductors, filters and similar devices and combinations thereof. As used herein the term "electrical component" may be understood to encompass any of the various types of semiconductor logic devices described above as well as resistors, capacitors, inductors, filters and similar passive devices, and other types of semiconductor devices.

Referring now to FIG. 3, a semiconductor device 40 is disclosed according to an embodiment of the invention. Semiconductor device 40 is depicted with break lines representing portions of the area array omitted for clarity purposes. Similar to semiconductor device 10 of FIG. 1, semiconductor device 40 includes an area array of signal, power, and ground I/O pads 12, 14, 16 formed on the topside or active surface 42 of the semiconductor base substrate 44 of the semiconductor device 40. I/O pads 12, 14, 16 may have a composition that includes a variety of electrically conductive materials such as aluminum, copper, gold, silver, nickel, or combinations thereof as non-limiting examples. I/O pads 12, 14, 16 provide conductive routes (I/O connections) to internal contacts such as transistors or logic gates formed within an internal contact region 43 (FIG. 4) of the semiconductor base substrate 44 proximate the active surface 42 of the semiconductor device 40. According to various embodiments, semiconductor device 40 may be a semiconductor logic device that includes hundreds of thousands, if not millions of internal contacts. These internal contacts are omitted from FIG. 4 for purposes of clarity and in light of the scale mismatch relative to the illustrated components. It is contemplated that the internal contacts of semiconductor logic device 40 may be constructed according to known techniques.

Figure 1:
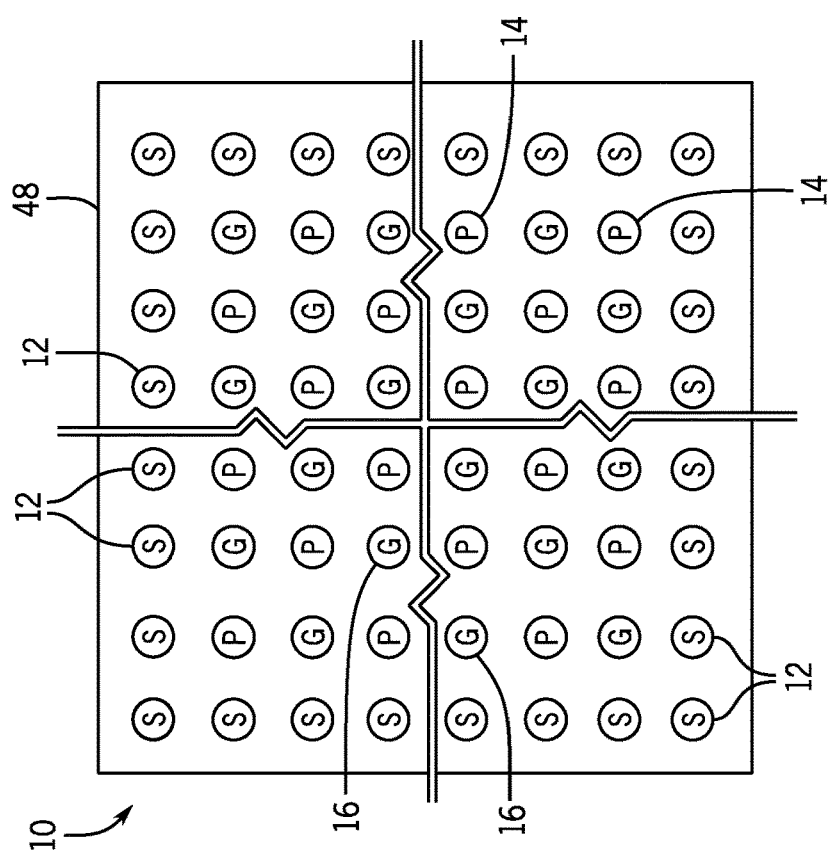
FIG. 1 is a schematic cross-sectional view of an exemplary, prior art semiconductor logic device.
Figure 2:
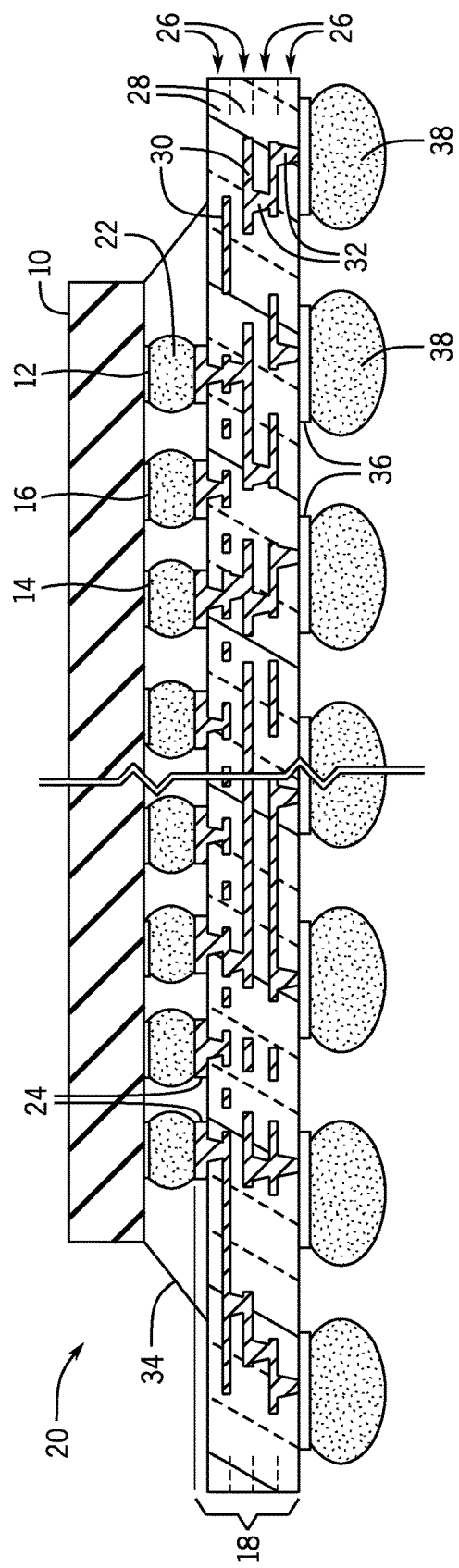
FIG. 2 is a schematic cross-sectional view of an exemplary prior art flip chip electronic package.

Semiconductor logic device 40 retains the same internal device functions and the same number of signal I/O pads 12 as the semiconductor logic device 10 of FIG. 1 but with a feature size reduction that results in an overall die shrink (i.e., a smaller outer perimeter 46) as compared to perimeter 48 of semiconductor logic device 10. This feature size reduction is accomplished by reducing the number of power and ground I/O pads 14, 16 and by reducing the pad pitch of the signal I/O pads 12. As used herein, the term "pitch" refers to the center-to-center distance between adjacent I/O pads. In one non-limiting embodiment, semiconductor logic device 40 has a die shrink of 23% as compared to the prior art semiconductor logic device 10 of FIG. 1 based on a 12.5% feature size reduction.

As shown in FIG. 3, signal I/O pads 12 of semiconductor logic device 40 are located in an exterior region adjacent perimeter 46 of the device 40 and arranged in the outer rows of the array that surround the area array of power and ground I/O pads 14, 16 that are located in the central region of device 40. In some embodiments, signal I/O pads 12 are arranged on a smaller pitch 50 than the minimum solderable pitch of device 10. In one exemplary and non-limiting embodiment pitch 50 is 130 microns. Therefore, in some embodiments, signal I/O pads 12 are formed at a non-solderable pitch. Semiconductor logic device 40 includes a reduced number of power I/O pads 14 and ground I/O pads 16 located in an interior region of the semiconductor logic device 40. Power and ground I/O pads 14, 16 have a larger surface area and a larger pitch 52 as compared to device 10 (FIG. 1). In some embodiments, the individual signal I/O pads 12 of semiconductor logic device 40 have a smaller surface area (e.g., have a smaller diameter) than power and ground I/O pads 14, 16.

One exemplary embodiment of semiconductor logic device 40 is described herein as Example A' to highlight distinctions between the previously described prior art construction of device 10 and embodiments of the present invention. However, the overall array arrangement and number of signal, power, and ground I/O pads 12, 14, 16 of device 40 may be varied based on particular design specifications in alternative embodiments. In Example A', semiconductor logic device 40 is a die shrunk version of the device 10 from Example A according to one embodiment of this invention. The die size has been shrunk from 4.5 mm by 4.5 mm to 3.9 mm by 3.9 mm, about a 25% die shrink based upon a feature size reduction of about 13%. It has the same number of signal I/O pads (116) as device 10 of Example A on a reduced pad pitch of 130 microns. It has an array of 20 by 20 I/O power and I/O ground pads formed in the center of the device on a larger pitch, 180 microns. Whereas non-shrunk device 10 of Example A had 392 I/O power pads and 392 I/O ground pads, shrunk device 40 of Example A' has 200 I/O power pads and 200 I/O ground pads. A similar die shrink may be carried out on a semiconductor device having a lower I/O count such as the device described above in Example B. In Example B' the die size has been shrunk from 1.2 mm by 1.2 mm to 1.05 mm by 1.05 mm, about a 25% die shrink based upon a feature size reduction of about 13%. The die shrunk device in Example B' has the same number of signal I/O pads, 28 as device 10 of Example B on a reduced pad patch of 130 microns. It has an array of 4 by 4 I/O power and I/O ground pads formed in the center of the device on a larger pitch, 180 microns. Whereas non-shrunk device 10 of Example B had 18 I/O power pads and 18 I/O ground pads, shrunk device 40 of Example B' as 8 I/O power pads and 8 I/O ground pads.

In the illustrated examples of this embodiment, semiconductor logic device 40 includes fewer power I/O pads 14 and ground I/O pads 16 than semiconductor logic device 10 (FIG. 1), each having a diameter of 100 microns with a pad pitch of 180 microns. One skilled in the art will recognize that the overall array arrangement, pitch 50, 52, pad size, and number of signal, power, and ground I/O pads 12, 14, 16 may be varied based on particular design specifications. Because the size of I/O pads 12, 14, 16 varies within semiconductor logic device 40 and the I/O pads 12, 14, 16 are arranged with a non-uniform inter-pad pitch, semiconductor logic device 40 is not compatible with flip chip solder assembly.

Figure 4:
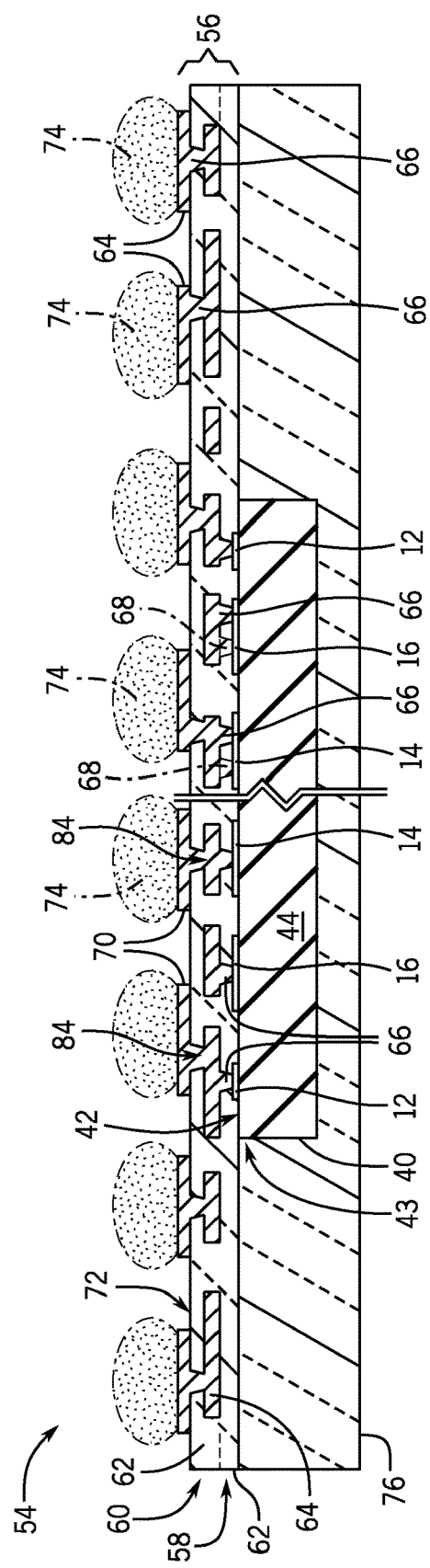
FIG. 4 is a schematic cross-sectional view of an electronic package according to an embodiment of the invention.

Semiconductor logic device 40 is, however, compatible with embedded chip assembly and can be incorporated within an embedded chip package or module such as the embedded semiconductor package 54 illustrated in FIG. 4. Instead of the solder bumps and copper pillar/solder paste connections of the prior art constructions, embedded chip package 54 includes direct metallurgical interconnections to the I/O pads 12, 14, 16 of semiconductor logic device 40 without any solder. These metallurgical interconnections are made by way of an overlay interconnect structure 56 that is formed on the topside, active surface 42 of semiconductor logic device 40. In the illustrated embodiment, overlay interconnect structure 56 includes a base interconnect layer 58 and a first rerouting interconnect layer 60. In other embodiments additional rerouting interconnect layers may be included or the first rerouting interconnect layer 60 may be omitted entirely as appropriate to achieve a desired routing pattern to I/O pads 12, 14, 16 of semiconductor logic device 40.

Base interconnect layer 58 is composed of an insulator or insulating layer 62 and a patterned conductive wiring layer 64 that includes conductive vias 66 or connections formed through the insulating layer 62 and in direct contact with the I/O pads 12, 14, 16. In some embodiments, base interconnect layer 58 also includes one or more optional parallel conductive vias 68 (shown in phantom). One or more of these additional conductive vias 68 may be formed between the conductive wiring layer 64 and any or all of the power I/O pads 14 and ground I/O pads 16, thereby forming parallel electrical connection pathways between a respective I/O pad 14, 16 and the conductive wiring layer 64. In an alternative embodiment, the conductive vias 66 connected to the larger power and ground I/O pads 14, 16 are formed larger (e.g., with a larger diameter) than the conductive vias 66 formed to the smaller signal I/O pads 12, thereby providing increased conductivity to the high current power and ground I/O pads 14, 16. In yet another embodiment, embedded semiconductor package 54 may include a combination of parallel conductive vias 68 and larger conductive vias 66 formed to the larger power and ground I/O pads 14, 16.

According to various embodiments, insulating layer 62 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, or inorganic films such as ceramic or glass, as non-limiting examples. Alternatively, insulating layer 62 may be provided as an organic film provided with an adhesive layer, a self-bonding film, such as, for example, an epoxy-fiber glass pre-preg, or a liquid dispensed dielectric that is cured in place.

Conductive wiring layer 64 is preferably a patterned metal layer such as aluminum, copper, gold, silver, nickel, or combinations thereof as non-limiting examples. However, other electrically conducting materials or a combination of metal and a filling agent may be used in other embodiments. Module I/O pads 70 are formed in the conductive wiring layer 64 on the outer surface 72 of the topmost rerouting interconnect layer 60. Optionally, solder balls 74 (shown in phantom) are formed or placed on the module I/O pads 70.

Semiconductor logic device 40 and exposed portions of the bottom surface of insulating layer 62 are encapsulated or coated in an insulating material 76. As used herein the phrase "insulating material" refers to an electrically insulating material or molding material that adheres to surrounding components of the electronics package such as a polymeric material (e.g., epoxy, liquid crystal polymer, ceramic or silica filled polymers) or other organic material as non-limiting examples. In one exemplary embodiment, insulating material 76 is an epoxy with filler particles to control the coefficient of thermal expansion (CTE). While insulating material 76 is illustrated as encapsulating the sides and backside of semiconductor logic device 40, insulating material 76 may be formed in a manner that leaves the backside of the device 40 exposed in alternative embodiments.

Referring now to FIGS. 5-7, select steps of a technique for manufacturing the embedded chip package 54 are set forth, according to one embodiment of the invention, with each figure illustrating a cross-section of the electronics package 54 during the build-up process. While FIGS. 5-7 illustrate the manufacture of a single electronics package, one skilled in the art will recognize that multiple electronics packages could be manufactured in a similar manner at the panel level and then singulated into individual electronics packages as desired.

Referring first to FIG. 5, fabrication of embedded chip package 54 begins by attaching the active surface 42 of semiconductor logic device 40 to the bottom surface 78 of insulating layer 62 using conventional pick and place equipment and methods. In some embodiments, such as, for example, embodiments where insulating layer 62 is provided in either an uncured or partial cured (i.e., B-stage) form and has adhesive properties, semiconductor logic device 40 is attached directly to insulating layer 62. Alternatively, an organic adhesive (not shown) can be applied either on insulating layer 62 or on the active surface 42 of semiconductor logic device 40 prior to positioning device 40 on insulating layer 62.

The manufacturing process continues in FIG. 6 by dispensing an insulating material 76 over and around the semiconductor logic device 40, thereby encapsulating the exposed portions of the bottom surface 78 of insulating layer 62, the side surfaces 82 of semiconductor logic device 40, and (optionally the backside surface 80). According to alternative and non-limiting embodiments, insulating material 76 may be applied using a spin coating, pour molding, transfer molding, injection molding, or compression molding process. Insulating layer 62 and insulating material 76 are fully cured, thermally or by way of a combination of heat or radiation. Suitable radiation may include UV light and/or microwaves. In one embodiment, a partial vacuum and/or above atmospheric pressure may be used to promote the removal of volatiles from the insulating layer 62 and insulating material 76.

A plurality of vias 84 are formed through insulating layer 62. As shown, vias 84 are formed to expose the signal, ground, and power I/O pads 12, 14, 16 of semiconductor logic device 40. Vias 84 may be formed by a direct write UV laser by laser ablation. Alternately, vias 84 may be formed by way of other methods utilizing a mask including: plasma etching, wet etching, photo-definition or other laser techniques like CO2 and excimer. In one embodiment, vias 84 are formed having angled side surfaces, as shown in FIG. 6, to facilitate the subsequent metal deposition step. Alternatively, vias 84 may be straight-sided. Vias 84 are subsequently cleaned such as through a reactive ion etching (RIE) desoot process or laser process.

The manufacturing technique continues by forming and patterning the conductive wiring layer 64 illustrated in FIG. 7. In one embodiment, conductive wiring layer 64 is formed by plating a conductor layer or metallization layer directly on insulating layer 62. According to alternative embodiments, the conductor layer contains a bulk metal such as copper, aluminum, or other standard wiring metal and may contain a barrier or adhesion metal such as titanium or chromium and is deposited by one or more of sputtering, evaporation, electroless plating, electroplating, or other standard metal deposition processes. Alternatively, the conductor layer is formed from an electrically conductive polymer or inks that contain conductive metal particles. When complete, the conductive wiring layer 64 extends through vias 84 to electrically couple with I/O pads 12, 14, 16. The conductive wiring layer 64 may be formed using any known patterning techniques such as, for example, fully subtractive patterning, semi-additive pattern plate-up, or additive plate-up. In yet other embodiments, conductive wiring layer 64 is a printed conductive material formed using a deposition technique such as inkjet printing, screen printing, or dispensing, as non-limiting examples.

After conductive wiring layer 64 is complete, additional redistribution or routing layers such as rerouting interconnect layer 60 (FIG. 4) may be formed atop base interconnect layer 58 using known techniques such as, for example, application of a spun on or flowable film followed by sputtering, plating, and a lithography process. The conductive wiring layer 64 on the topmost rerouting interconnect layer 58 or 60 is patterned to form module I/O pads 70. Thereafter, optional solder bumps or solder balls 74 (shown in phantom) may be formed on or attached to the module I/O pads 70 to yield the embedded chip package 54 shown in FIG. 4.

One skilled in the art will recognize that alternative materials and process steps could be used to form the embedded chip package 54 of FIG. 4. For example, semiconductor logic device 40 could be molded into insulating material 76 prior to bonding the semiconductor logic device 40 to the insulating layer 62. In such an embodiment, base interconnect layer 58 would be laminated over the semiconductor logic device 40 and the upper surface of the insulating material 76.

Figure 8:
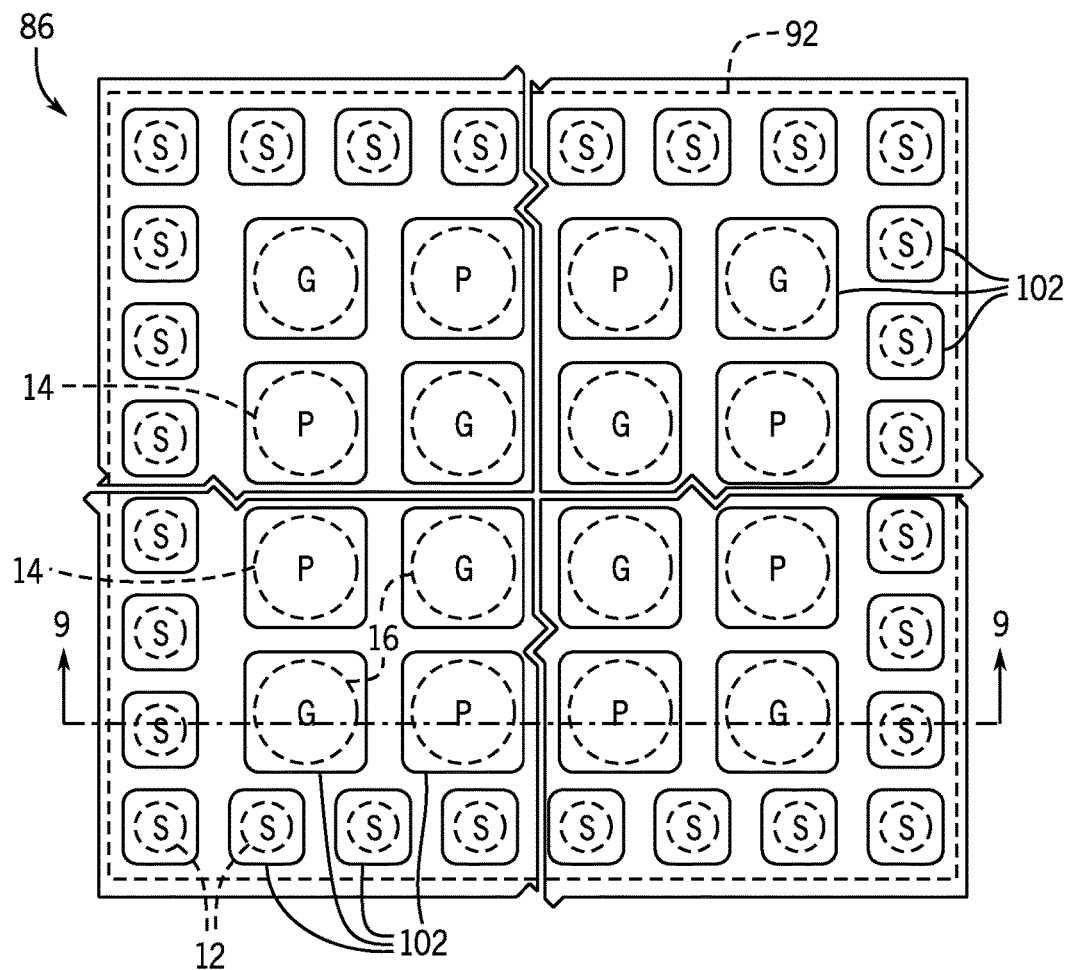
FIG. 8 is a schematic top view of a portion of a wafer-level reconfigured semiconductor logic structure including a redistribution layer, according to an embodiment of the invention.

FIG. 8 depicts a portion of a wafer-level reconfigured semiconductor logic structure 86, according to another embodiment of the invention. The wafer-level reconfiguration structure and manufacturing technique described herein may be used to optimize a semiconductor logic device that has undergone a die shrink, such as, for example device 40 of FIG. 3, for insertion into an embedded chip package. Reconfigured semiconductor logic structure 86 is formed by constructing an on-wafer redistribution structure 88 or reconfiguration layer on a completed semiconductor wafer 90 that includes a number of die sites 92 with I/O pads 12, 14, 16 arranged in a similar manner as semiconductor logic device 40 (FIG. 3). While described as being formed at the wafer level, it is contemplated that the techniques described herein for fabricating redistribution structure 88 can be extended to forming one or more redistribution layers at the die level on singulated semiconductor logic devices.

Figure 9:
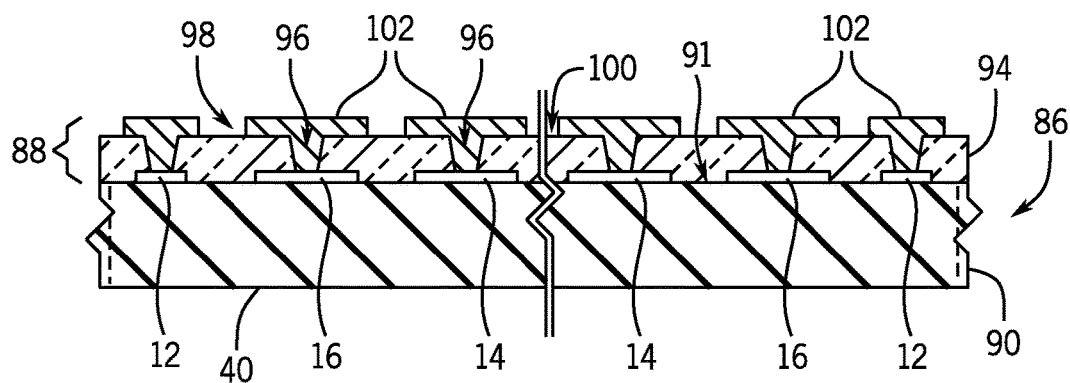
FIG. 9 is a schematic cross-sectional view of a portion of the wafer-level reconfigured semiconductor logic structure of FIG. 8, according to an embodiment of the invention.

As shown in the cross-sectional view provided in FIG. 9, on-wafer redistribution structure 88 includes an insulating layer 94 that is applied to the active surface 42 of wafer 90. Insulating layer 94 is preferably an organic resin such as, for example, a polyimide, Ultem®, bismaleimide-triazine (BT) resin, liquid crystal polymer, benzocyclobutane (BCB), polyetherimide, epoxy, epoxy-glass or the like. However, it is contemplated that insulating layer 94 may be formed of any of the same materials described above for insulating layer 62. Insulating layer 94 may be applied by any known technique such as, for example, spin coating, spray coating, evaporation, or meniscus coating. After device singulation, the insulating layer 94 has the same or substantially the same surface area or footprint of the underlying semiconductor base substrate.

After insulating layer 94 is cured, vias 96 are formed through insulating layer 94 to the I/O pads 12, 14, 16 of semiconductor logic device 40. Vias 96 may be fabricated using known techniques such as, for example, laser ablation, plasma etch, chemical etch, or a combination of such. In some embodiments, vias 96 may be formed with a diameter of 10-50 microns. However, the dimensions of vias 96 may fall outside of this range in alternative embodiments. Optionally, the vias 96 formed to the larger power and ground I/O pads 14, 16 may have a larger diameter than those formed to the smaller signal pads 12 to enable higher current capability and lower interconnect resistance for the electrical connections formed to power and ground I/O pads 14, 16.

A conductive layer 98 is formed on the outer surface 100 of the insulating layer 94 and extends into vias 96, and onto exposed portions of I/O pads 12, 14, 16, forming electrical connections between conductive layer 98 and I/O pads 12, 14, 16. Conductive layer 98 may be applied by one or more of sputtering, evaporation, electroless plating, and electroplating, for example. Conductive layer 98 may be formed of any of the same materials as described for conductive wiring layer 64 (FIG. 4). While FIG. 9 only illustrates one via 96 per power and ground I/O pad 14, 16, it is contemplated that two or more vias 96 may be formed per I/O pad 14, 16 in alternative embodiments to enable formation of parallel conductive paths between conductive layer 98 and a respective power or ground I/O pad 14, 16 in a manner equivalent to that described with respect to conductive vias 66 and 68 of FIG. 4.

As shown in FIGS. 8 and 9, conductive layer 98 is patterned to form an array of discrete terminal pads 102 that are electrically isolated from one another and electrically coupled to respective I/O pads 12, 14, 16. In some embodiments, conductive layer 98 may be patterned to include additional routing traces (not shown). The patterning can be done for example by standard additive, semi-additive, or subtractive patterning processes. Terminal pads 102 have a larger surface than that of their respective I/O pads 12, 14, 16. In one embodiment, terminal pads 102 are at least twice as large as their respective I/O pads 12, 14, 16. While terminal pads 102 are illustrated in FIG. 8 with a substantially circular geometry, it is contemplated that terminal pads 102 may be formed as rectangular elements or with any alternative geometrical configuration. In the embodiment illustrated in FIG. 8, terminal pads 102 are vertically aligned with the underlying I/O pads 12, 14, 16. In other words terminal pads 102 are formed directly over or substantially directly over respective I/O pads 12, 14, 16. Alternatively, it is contemplated that terminal pads 102 may be formed atop the insulating layer 94 at locations adjacent to or remote from the device I/O pads 12, 14, 16.

While the wafer-level reconfigured semiconductor logic structure 86 is disclosed herein as including a single on-wafer redistribution layer 88, it is contemplated that one or more additional redistribution layers may be formed atop redistribution layer 88 in alternative embodiments to achieve a desired reconfigured pattern of terminal pads 102, with the topmost layer including a configuration of discrete terminal pads 102 that are electrically connected to underlying I/O pads 12, 14, 16 by way of the conductive layer(s) of one or more intermediate redistribution layers. Once the reconfiguration layer(s) 88 is/are complete the wafer-level reconfigured semiconductor logic structure 86 may be singulated into individual reconfigured semiconductor logic devices. In a singulated reconfigured semiconductor logic device, the overall footprint of the reconfiguration layer(s) 88 is equal to that of the underlying semiconductor logic device 40. As such, the insulating layer 94 and conductive layer 98 do not extend beyond the outer perimeter 46 of the underlying semiconductor logic device 40.

Figure 10:
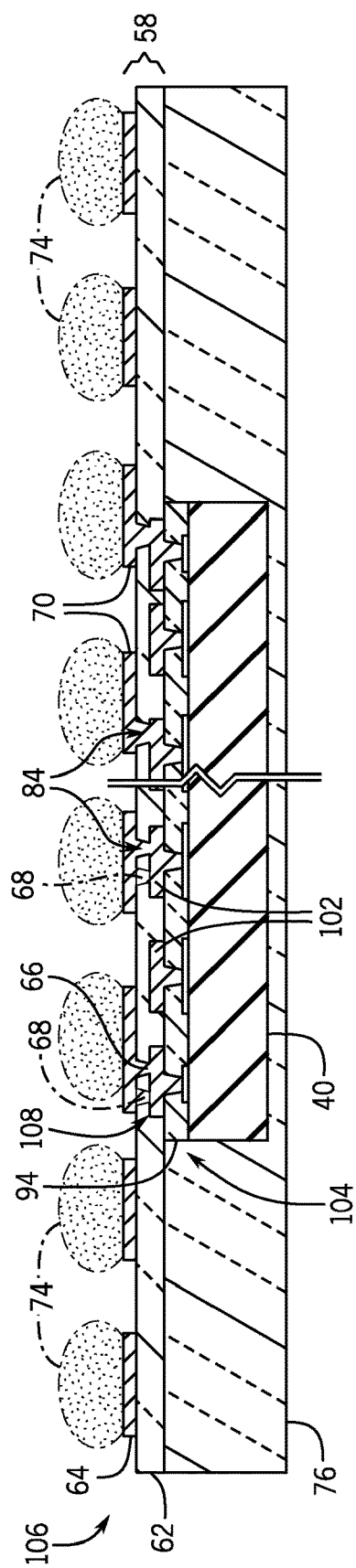
FIG. 10 is a schematic cross-sectional view of an electronic package including a reconfigured semiconductor logic device, according to an embodiment of the invention.

FIG. 10 depicts one such reconfigured semiconductor device 104 embedded within an electronics package 106, according to an embodiment of the invention. Embedded semiconductor package or electronics package 106 includes a number of similar components as embedded chip package 54 (FIG. 4), which are referred to with common part numbering as appropriate. The top surface 108 of reconfigured semiconductor logic device 104 is affixed to insulating layer 62 either through adhesive properties of the insulating layer 62 itself or by way of an intermediate bonding or attachment layer (not shown). A conductive wiring layer 64 is formed atop insulating layer 62 and extends through a series of vias 84 formed therethrough to electrically couple with the terminal pads 102 of the reconfigured semiconductor logic device 104. Together, insulating layer 62 and conductive wiring layer 64 with its conductive vias 66 form a base interconnect layer 58 similar to that of FIG. 4. Reconfigured semiconductor logic device 104 is at least partially embedded within an insulating material 76 or molding material that surrounds the side surfaces (and optionally the backside) of reconfigured semiconductor logic device 104 and the exposed bottom surfaces of insulating layer 62. As shown, the insulating material 76 coats the side surfaces of the insulating layer 94, which does not extend beyond the side surfaces of the underlying semiconductor logic device 40.

Similar to the configuration described with respect to FIG. 4, base interconnect layer 58 may be constructed with optional conductive vias 68 (shown in phantom). In electronics package 106, these conductive vias 68 form parallel conductive pathways or electrical connections between a respective terminal pad 102 of reconfigured semiconductor logic device 104 and conductive wiring layer 64. The larger footprint of terminal pads 102 permits one or more of these parallel conductive vias 68 to be formed to terminal pads 102 associated with signal I/O pads 12, as well as to the power and ground I/O pads 14, 16. Alternatively, the conductive vias 66 connected to the larger power and ground I/O pads 14, 16 may be larger (e.g., have a larger diameter) than the conductive vias 66 formed to the smaller signal I/O pads 12, thereby providing increased conductivity to the higher current power and ground I/O pads 14, 16. In yet another embodiment, electronics package 106 may include a combination of parallel conductive vias 68 and larger conductive vias 66 formed to the terminal pads 102.

In the illustrated embodiment the conductive wiring layer 64 of base interconnect layer 58 is patterned to form module I/O pads 70 and embedded chip package 106 may include optional solder bumps or solder balls 74 (shown in phantom) connected to the module I/O pads 70. In other embodiments, one or more additional rerouting interconnect layers may be formed atop base interconnect layer 58 in the manner described above with respect to element 60 of FIG. 4 to add additional routing capability for more complex semiconductor logic devices.

Figure 11:
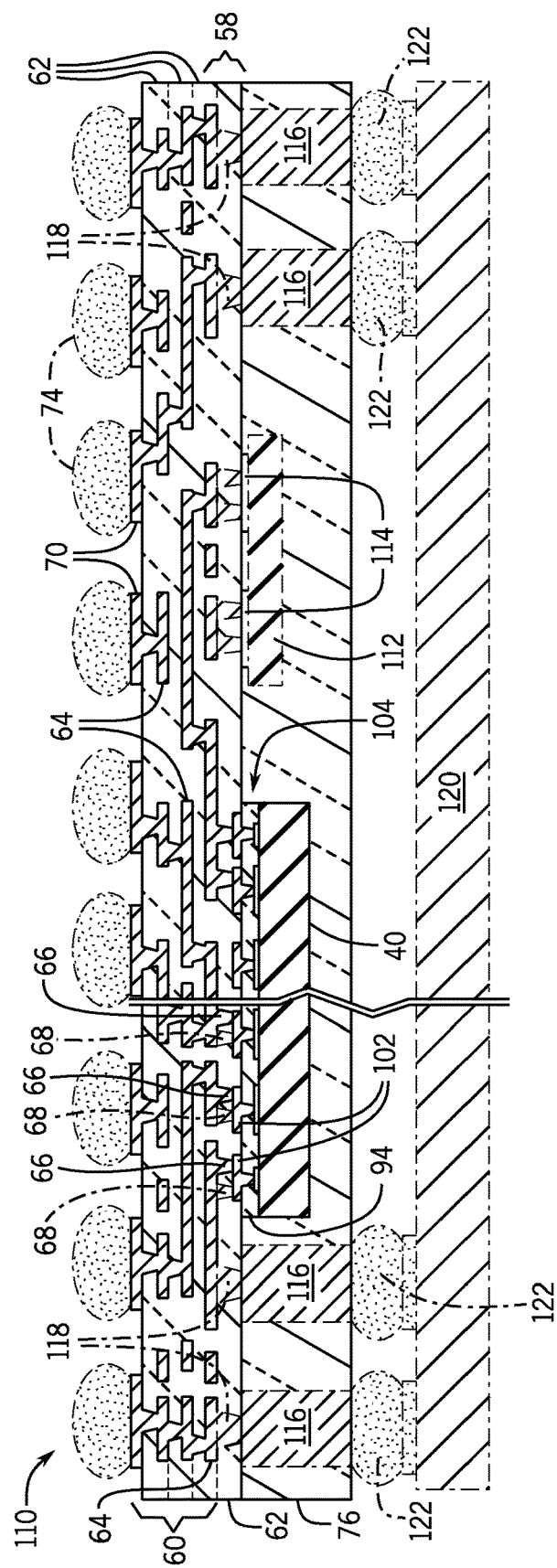
FIG. 11 is a schematic cross-sectional view of an electronic package including a reconfigured semiconductor logic device, according to another embodiment of the invention.

Referring now to FIG. 11, an embedded multichip module 110 is illustrated according to an embodiment of the invention. Embedded multichip module 110 includes reconfigured semiconductor logic device 104, at least one additional component, and a number of other elements similar to those described above with respect to FIGS. 4-10, which are referred to with common part numbering with respect to FIG. 11.

Similar to embedded chip package 106 of FIG. 10, embedded multichip module 110 includes a reconfigured semiconductor logic device 104 attached to the insulating layer 62 of base interconnect layer 58 and embedded in a cavity within insulating material 76. In some embodiments, embedded multichip module 110 also includes at least one additional microelectronics device 112 (shown in phantom) embedded within a second cavity within insulating material 76 adjacent reconfigured semiconductor logic device 104. According to exemplary embodiments, microelectronics device 112 may be a semiconductor device, a passive device, a MEMS device, an acoustic device, or other type of electrical component. The conductive wiring layer 64 of the base interconnect layer 58 is electrically coupled to the terminal pads 102 of reconfigured semiconductor logic device 104 and to contact pads 114 of microelectronics device 112, as shown in FIG. 11. In the illustrated embodiment, embedded multichip module 110 includes three rerouting interconnect layers 60 formed atop base interconnect layer 58. However, more or less rerouting interconnect layers 60 may be included in alternative embodiments based on the desired I/O routing structure and module complexity. Similar to the configuration described with respect to FIG. 4, base interconnect layer 58 may be constructed with one or more optional conductive vias 68 (shown in phantom) and/or with larger conductive vias 66 formed to terminal pads 102.

Optionally, embedded multichip module 110 includes one or more through connectors or through molding vias (TMVs) 116 (shown in phantom), which are formed through the thickness of insulating material 76 and bring selected signals, power, and ground connections to the bottom surface of the insulating material 76 to facilitate connection to other circuitry. Through connectors 116 are preferably metal such as, for example, copper, aluminum, or stainless steel, but may be any type of electrically conductive material in alternative embodiments. Through connectors 116 may be formed by any known technique such as electroless plating and/or electroplating for example. These through connectors 116 are electrically coupled to conductive wiring layer 64 by way of additional metalized vias 118 (also shown in phantom).

Embedded multichip module 110 may also include an optional second microelectronics package 120 (shown in phantom) mounted to the through connectors 116 with optional solder balls 122 (shown in phantom) to form a package-on-package structure. Microelectronics package 120 may include one semiconductor device or multiple semiconductor devices such as, for example, a stack of memory chips within an area array package. Microelectronics package 120 may be mounted to one or more of the module I/O pads 70 in an alternative embodiment.

It is contemplated that the reconfigured semiconductor logic device 104 in embedded multichip module 110 may be replaced with the semiconductor logic device 40 of FIG. 4 in an alternative embodiment.

FIGS. 12-14 depict an alternative method of embedding a reconfigured semiconductor logic device, such as device 104 of FIG. 10, according to an embodiment of the invention. Referring first to FIG. 12, the method begins by coating a plate or platen 200 with a layer of temporary adhesive or bonding material 202. The singulated reconfigured semiconductor logic device 104 is placed active surface down onto the layer of temporary bonding material 202 as shown in FIG. 13. Next, molding resin or insulating material 76 is dispensed to embed the device 104 and exposed portions of the temporary bonding material 202. In some embodiments, insulating material 76 is dispensed in a manner that leaves the backside of the device 40 exposed. Insulating material 76 can be dispensed by one of injection molding, compression molding, pour molding and fluid jetting, as non-limiting examples. After curing insulating material 76, the combined assembly of cured insulating material 76 and device 104 is removed from the temporary bonding material 202 and platen 200. As shown in FIG. 14, the top surface 204 of device 104 is co-planar or substantially co-planar with the top surface 206 of the cured insulating material 76. At this point, one or more interconnect layers 58, 60 can be formed over the device 104 and the top surface 206 of insulating material 76.

The I/O pad design and area array configurations disclosed herein permit high I/O count semiconductor logic devices to be designed with far fewer power and ground I/O pads than possible for flip chip or wire bond assembly. Increasing the surface area of these power and ground I/O pads provides the respective contact points with higher current carrying capability and permits the device to be designed with a smaller footprint than capable for flip chip or wire bond assembly, thereby increasing the number of die per wafer and thus lowering fabrication costs. In the case of a typical 10-15% feature size reduction, embodiments of the invention permit a semiconductor logic chip to be designed with a 20-30% die size reduction and a potential 15-20% reduction in wafer fabrication costs.

Beneficially, embodiments of this invention provide the capability of reducing the die size of a complex, high I/O count semiconductor logic device by reducing the number of power and ground I/O pads when redesigning the device for a smaller feature size semiconductor fabrication node. Embodiments of the semiconductor logic devices disclosed herein enable the I/O pads for power and ground to be larger than the I/O pads for signals, further lowering interconnect parasitics within an embedded chip module. The larger ground and power I/O pads can be arranged at a larger pitch than the smaller signal I/O pads, further adding to flexibility in device design. This would allow for smaller semiconductor logic devices providing higher wafer yields, more devices per wafer and lower device costs.

By reducing the number of I/O pads at the device level, the semiconductor logic chips can be incorporated into embedded chip packages with a less complex interconnect structure, thereby reducing yield losses associated with interconnect defects. Also, the larger I/O pads and/or terminal pads formed either at the device-level or on the reconfiguration layer in alternative embodiments allow the formation of multiple vias to a common terminal pad or I/O pad. These multiple vias provide increased conductivity and redundant, parallel electrical connections between the interconnect structure and respective I/O pads on the semiconductor logic device, thereby increasing layer-to-layer conductivity and interconnect yields.

On the package-level, embodiments of the invention provide for higher power delivery and higher semiconductor logic device performance than state-of-the-art flip chip solder bump approaches, including a ten-fold reduction in interconnect resistance, a ten-fold increase in current carrying capability and a thinner package as compared with flip chip solder bump. The electrical interconnections to the I/O pads 12, 14, 16 of semiconductor logic device 40 are not susceptible to solder fatigue, electro-migration, or pad-to-pad solder shorts since they are formed without solder. Further, use of embedded chip assembly permits a complex semiconductor logic device with thousands of I/O pads to undergo a die shrink without losing electrical performance. Embodiments of the invention disclosed herein also provide higher electrically performance and higher interconnect yield than prior art embedded semiconductor chip packages, with a four-fold reduction in interconnect resistance, and a four-fold increase in current carrying capability compared to other embedded chip approaches. Accordingly, the embodiments described herein provide a low-cost solution with higher performance as compared to prior art approaches.

Therefore, according to one embodiment of the invention, an embedded semiconductor package includes a semiconductor logic device comprising a plurality of signal input/output (I/O) pads spaced at a first pitch on an active surface thereof and a plurality of power I/O pads and a plurality of ground I/O pads spaced on the active surface at a second pitch larger than the first pitch. At least one interconnect layer overlies the semiconductor logic device. Each of the at least one interconnect layers includes an insulating layer and a conductive layer formed on the insulating layer and extending into a plurality of vias formed therethrough. The conductive layer is electrically coupled to the plurality of signal I/O pads, the plurality of power I/O pads, and the plurality of ground I/O pads.

According to another embodiment of the invention, a semiconductor logic device includes a semiconductor base substrate, a plurality of signal input/output (I/O) pads arranged on a first surface of the semiconductor base substrate at a first pitch, and a plurality of power I/O pads and a plurality of ground I/O pads arranged on the first surface of the semiconductor base substrate at a second pitch that is greater than the first pitch. The plurality of signal I/O pads, the plurality of power I/O pads, and the plurality of ground I/O pads provide conductive routes to internal contacts within the semiconductor base substrate.

According to yet another embodiment of the invention, a method of manufacturing a semiconductor package includes coupling an active surface of a semiconductor logic device to an insulating layer, the active surface comprising a plurality of signal input/output (I/O) pads arranged at a first pitch and a plurality of power I/O pads and ground I/O pads arranged at a second pitch greater than the first pitch. The method also includes forming a plurality of vias through the insulating layer to the plurality of signal I/O pads, power I/O pads, and ground I/O pads, forming a conductive wiring layer on the insulating layer and extending into the plurality of vias, and disposing an insulating material around at least a portion of the semiconductor logic device and an exposed first surface of the insulating layer.

According to yet another embodiment of the invention, an embedded semiconductor package includes a semiconductor logic device comprising a plurality of input/output (I/O) pads formed on an active surface thereof and a reconfiguration layer formed over the active surface of the semiconductor logic device. The reconfiguration layer includes an insulating layer disposed on the active surface of the semiconductor logic device and a conductive layer comprising discrete terminal pads formed atop the insulating layer and extending through vias therein to electrically couple with respective I/O pads of the plurality of I/O pads. The discrete terminal pads include a first plurality of discrete terminal pads of a first size and a second plurality of discrete terminal pads of a second size larger than the first size. The embedded semiconductor package also includes at least one rerouting interconnect layer comprising an insulator formed atop the reconfiguration layer and conductive connections that extend through the insulator and that are electrically coupled to the plurality of I/O pads by way of the plurality of discrete terminal pads. An insulating material surrounds side surfaces of the semiconductor logic device and side surfaces of the insulating layer of the reconfiguration layer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An embedded semiconductor package comprising:
   a semiconductor logic device comprising:
      a plurality of signal input/output (I/O) pads spaced at a first pitch on an active surface thereof; and
      a plurality of power I/O pads and ground I/O pads spaced on the active surface at a second pitch larger than the first pitch; and
   at least one interconnect layer overlying the semiconductor logic device, each of the at least one interconnect layers comprising:
      an insulating layer; and
      a conductive layer formed on the insulating layer and extending into a plurality of vias formed therethrough, the conductive layer electrically coupled to the plurality of signal I/O pads and the plurality of power I/O pads and ground I/O pads.

2. The embedded semiconductor package of claim 1 further comprising an insulating material surrounding side surfaces of the semiconductor logic device and coating a portion of the insulating layer of an interconnect layer of the at least one interconnect layer.

3. The embedded semiconductor package of claim 1 wherein the plurality of power I/O pads and the plurality of ground I/O pads are larger than the plurality of signal I/O pads.

4. The embedded semiconductor package of claim 1 wherein the at least one interconnect layer comprises:
   a base interconnect layer having its conductive layer in direct contact with the plurality of signal I/O pads and the plurality of power I/O pads and ground I/O pads; and
   at least one additional rerouting interconnect layer formed atop the base interconnect layer.

5. The embedded semiconductor package of claim 4 wherein the conductive layer of the base interconnect layer extends through at least two vias of the plurality of vias to form parallel electrical connections to at least one of a common power I/O pad and a common ground I/O pad of the plurality of power I/O pads and the plurality of ground I/O pads.

6. The embedded semiconductor package of claim 1 further comprising a plurality of solder balls electrically coupled to the at least one interconnect layer.

7. A semiconductor logic device comprising:
   a semiconductor base substrate;
   a plurality of signal input/output (I/O) pads arranged on a first surface of the semiconductor base substrate at a first pitch; and
   a plurality of power I/O pads and a plurality of ground I/O pads arranged on the first surface of the semiconductor base substrate at a second pitch that is greater than the first pitch;
   wherein the plurality of signal I/O pads, the plurality of power I/O pads, and the plurality of ground I/O pads provide conductive routes to internal contacts within the semiconductor base substrate.

8. The semiconductor logic device of claim 7 wherein the plurality of signal I/O pads are smaller than the plurality of power I/O pads and the plurality of ground I/O pads.

9. The semiconductor logic device of claim 7 wherein the plurality of power I/O pads and the plurality of ground I/O pads are confined to an interior region of the first surface of the semiconductor base substrate; and wherein the plurality of signal I/O pads are arranged in an area array that surrounds the plurality of power I/O pads and the plurality of ground I/O pads.

10. The semiconductor logic device of claim 7 wherein the first pitch is less than a minimum solderable pitch for a flip chip attachment technique.

11. The semiconductor logic device of claim 7 wherein the first pitch is less than 150 microns.

12. The semiconductor logic device of claim 7 wherein the first pitch is less than 100 microns.

13. The semiconductor logic device of claim 7 wherein the combined sum of the plurality of signal I/O pads, the plurality of power I/O pads, and the plurality of ground I/O pads is greater than 100.

14. A method of manufacturing a semiconductor package comprising:

coupling an active surface of a semiconductor logic device to an insulating layer, the active surface comprising a plurality of signal input/output (I/O) pads arranged at a first pitch and a plurality of power I/O pads and ground I/O pads arranged at a second pitch greater than the first pitch;

forming a plurality of vias through the insulating layer to the plurality of signal I/O pads and the plurality of power I/O pads and ground I/O pads;

forming a conductive wiring layer on the insulating layer and extending into the plurality of vias; and disposing an insulating material around at least a portion of the semiconductor logic device and an exposed first surface of the insulating layer.

15. The method of claim 14 further comprising forming at least one rerouting interconnection layer over the conductive wiring layer and an exposed second surface of the insulating layer.

16. The method of claim 14 further comprising forming at least two vias of the plurality of vias to one of a common ground I/O pad and a common power I/O pad.

17. An embedded semiconductor package comprising:

a semiconductor logic device comprising a plurality of input/output (I/O) pads formed on an active surface thereof;

a reconfiguration layer formed over the active surface of the semiconductor logic device, the reconfiguration layer comprising:

an insulating layer disposed on the active surface of the semiconductor logic device; and a conductive layer comprising discrete terminal pads formed atop the insulating layer and extending through vias therein to electrically couple with respective I/O pads of the plurality of I/O pads;

wherein the discrete terminal pads comprise a first plurality of discrete terminal pads of a first size and a second plurality of discrete terminal pads of a second size larger than the first size;

at least one rerouting interconnect layer comprising:

an insulator formed atop the reconfiguration layer; and conductive connections that extend through the insulator and that are electrically coupled to the plurality of I/O pads by way of the first and second pluralities of discrete terminal pads; and an insulating material surrounding side surfaces of the semiconductor logic device and side surfaces of the insulating layer of the reconfiguration layer.

18. The embedded semiconductor package of claim 17 wherein the second plurality of discrete terminal pads are electrically coupled to a plurality of ground I/O pads and a plurality of power I/O pads of the plurality of I/O pads.

19. The embedded semiconductor package of claim 17 wherein a bottom surface of the reconfiguration layer contacts the active surface of the semiconductor logic device and a top surface of the reconfiguration layer contacts a bottom surface of an insulator of the at least one rerouting interconnect layer.

20. The embedded semiconductor package of claim 17 further comprising at least one electronic component embedded within the insulating material and electrically coupled to the at least one rerouting interconnect layer.

21. The embedded semiconductor package of claim 17 further comprising through conductors extending through the insulating material and electrically coupled to the at least one rerouting interconnect layer.

22. The embedded semiconductor package of claim 1 wherein the plurality of power I/O pads and ground I/O pads are located in a central region of the active surface; and wherein the plurality of signal I/O pads are located between a perimeter of the active surface and the central region.

23. The embedded semiconductor package of claim 1 wherein I/O pads of the plurality of power I/O pads and ground I/O pads are positioned adjacent one another on the active surface absent any signal I/O pads of the plurality of signal I/O pads positioned therebetween.

24. The semiconductor logic device of claim 7 wherein a first power I/O pad of the plurality of power I/O pads is positioned adjacent a first ground I/O pad of the plurality of ground I/O pads absent any signal I/O pads of the plurality of signal I/O pads positioned therebetween; and wherein the first power I/O pad and the first ground I/O pad are arranged at the second pitch.

25. The semiconductor logic device of claim 7 wherein the plurality of signal I/O pads are arranged proximate a perimeter of the first surface; and wherein the plurality of power I/O pads and the plurality of signal I/O pads are arranged in a central region of the first surface.

26. The method of claim 14 wherein the plurality of power I/O pads and ground I/O pads are arranged in an array located in a central region of the active surface; and wherein the plurality of signal I/O pads are arranged in an array that surrounds the central region.

27. The embedded semiconductor package of claim 17 wherein the second plurality of discrete terminal pads are arranged in an area array; and wherein the first plurality of discrete terminal pads are arranged in a perimeter array that surrounds the area array.

\* \* \* \* \*